March 14, 1967 I. HOROWITZ 3,309,612

CONVERTER APPARATUS EMPLOYING NEGATIVE RESISTANCE MIXER

Filed Oct. 21, 1963

INVENTOR
IRVING HOROWITZ

BY Rines and Rines

ATTORNEYS

United States Patent Office 3,309,612

Patented Mar. 14, 1967

3,309,612

CONVERTER APPARATUS EMPLOYING NEGATIVE RESISTANCE MIXER

Irving Horowitz, Eatontown, N.J., assignor to Blonder-Tongue Electronics, Newark, N.J., a corporation of New Jersey Filed Oct. 21, 1963, Ser. No. 317,528
5 Claims. (Cl. 325—449)

The present invention relates to converter apparatus and, more specifically, to ultra-high-frequency converters.

Among the long-standing problems in high-frequency converters, such as those employed for ultra-high-frequency television reception and the like, is the effect upon the local oscillator of wide variations in impedance reflected back through the intermediate-frequency stages by misadjustment of the television tuner or tuning to unintended channels. Such variations can range from substantially short-circuit to substantially open-circuit conditions; and, particularly if the local oscillator employs a negative-resistance mixing element, such as a tunnel diode or like, that serves also as the oscillator electron device, results in pulling the local oscillation frequency from its intended value or setting up spurious oscillations with the device. While buffer and isolation circuits, as well as heavy choking may be employed to minimize these effects, these remedies disadvantageously require considerable ancillary equipment and are costly and cumbersome in adjustment.

An object of the present invention, accordingly, is to provide a new and improved converter apparatus of the above-described character that shall not be subject to such disadvantages but that, in summary, through novel rather simple but critical electrical circuits embodying the negative-resistance oscillating and mixing element itself, prevents spurious oscillation with the element even though the intermediate-frequency stages may suffer extreme changes from substantially short to open circuit conditions.

A further object is to provide an novel converter apparatus of more general utility, also.

Figures 2, 3:
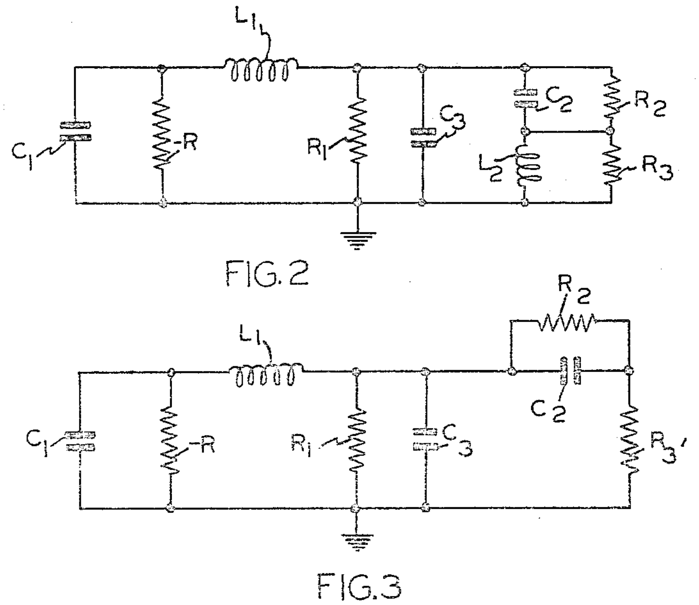

Other and further objects will be pointed out hereinafter and will be more fully set forth in the appended claims, the invention now being described in connection with the accompanying drawing, FIG. 1 of which is a schematic circuit diagram of a preferred embodiment thereof;

FIG. 2 is a simplified equivalent circuit for open-circuit conditions at the intermediate-frequency stages; and FIG. 3 is a diagram similar to FIG. 2 for short-circuit conditions.

Figure 1:
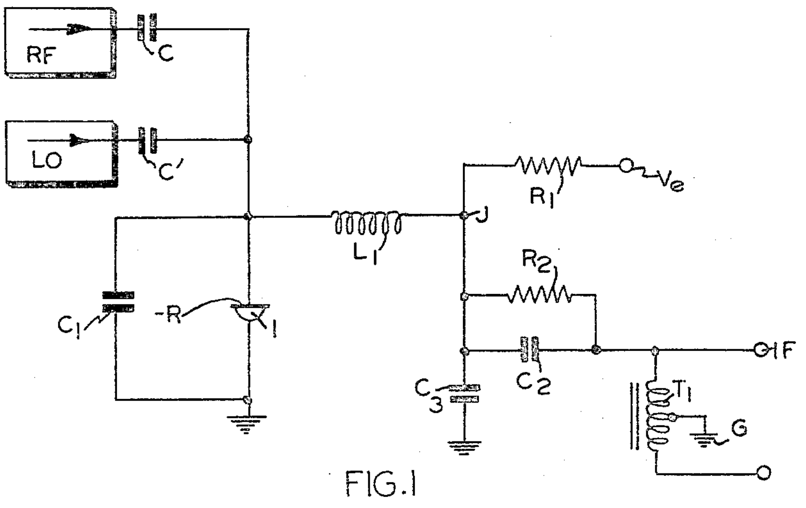

Referring to FIG. 1, a tunnel diode 1, or similar negative-resistance mixing element, the negative resistance of which is schematically represented at —R, is shown provided with a suitable shunt capacitance $C_1$ to oscillate at a desired local oscillation frequency with a tuned circuit labelled LO to which it is more tightly coupled through capacitance C′ than it is coupled through capacitance C to the input radio-frequency stage or stages R.F. The element 1 thus serves not only as the local oscillator electron relay or device, but as the mixer for producing the desired intermediate frequency by beating the radio-frequency and local oscillations; say, an intermediate frequency of 82 megacycles for the ultra-high-frequency radio frequency band of 470 to 890 megacycles and tracking local oscillations of from 388 to 808 megacycles, respectively.

The direct-current supply for the tunnel diode 1 comprises a resistive voltage divider including resistance $R_1$ connected to the negative supply terminal *—vs*, resistance $R_2$, and an output autotransformer $T_1$, intermediately tapped to ground G and connected to the intermediate-frequency stage or stages, labelled I.F. The junction J between resistances $R_1$ and $R_2$ of this divider connects through a choke impedance $L_1$, adjusted to suppress both the radio frequencies and the local oscillation frequencies, to the upper terminal of the tunnel diode element 1. The choke $L_1$, in accordance with the invention, serves as a series arm of an important critical $\pi$-type low-pass network, the left-hand shunt arm of which comprises the negative resistance —R of the combined mixer and oscillator relay 1 and its shunt capacitance $C_1$. The junction J is by-passed at $C_3$, and capacitance $C_2$ shunts divider resistor $R_2$ to serve as part of the right-hand shunt arm of the $\pi$-network, as now explained.

Considering the mismatched extreme of a short-circuit condition reflected back from the intermediate-frequency stages I.F., the alternating-current equivalent circuit of the system of FIG. 1 is that of FIG. 2, with the parallel branch $R_2—C_2$ being connected with a paralleled-branch $L_2—R_3$ (representing, respectively, the leakage inductance of $T_1$ and losses of leakage therein), both connected across $R_1$ and $C_3$ to constitute the right-hand shunt arm of the $\pi$-network. By appropriate adjustment of the ratio of this composite right-hand shunt arm and the left-hand shunt arm $—R—C_1$, including appropriate value of the losses $R_3$ in the transformer $T_1$, the positive resistance reflected back from I.F. for this short-circuit condition may be made less than the value of the negative resistance —R of the element 1 at frequencies blow the R.F. and LO frequencies. Thus, spurious oscillation with 1 and variation of the local oscillation developed through 1 are avoided. Since, in the other extreme condition of effective open circuit at I.F., the shunt losses $R_3$ in $T_1$ serve also as an important component of the right-hand $\pi$-network shunt arm, the other elements being $R_1—C_3$ in shunt and a parallel combination of $R_2$ and $C_2$ in series, FIG. 1, the adjustment of the shunt arm ratio and the transformer losses can once more serve to provide a positive reflected resistance of magnitude less than —R and thus prevent any possibility of such spurious oscillation through the element 1.

In the UHF range, before mentioned, for example, with a lossy iron-core autotransformer $T_1$ representing substantial loss at the resonant frequency of the $\pi$-network, values of $R_3$=390 ohms, $R_2$ of smaller value of 56 ohms, $C_3$ of value 6.8 $\mu\mu f.$, and $C_2$ of much greater value of 22 $\mu\mu f.$, have been found to provide the required adjustment to insure a reflected positive resistance less than the 110-ohm negative resistance —R of a General Electric Type TD–1 tunnel diode 1.

Modifications will occur to those skilled in the art and all such are considered to fall within the spirit and scope of the invention as defined in the appended claims.

What is claimed is:

1. Converter apparatus having, in combination, a two-terminal negative-resistance mixing element for producing an intermediate frequency from radio-frequency and local-oscillation frequency inputs thereto, a radio-frequency and local-oscillation-frequency-suppressing impedance element connected to the mixing element, a resistive direct-current voltage divider connected to the said impedance element and to intermediate-frequency stage means, and means for preventing spurious oscillation with the mixing element at frequencies in the region of the said intermediate frequency caused by impedance changes ranging from substantial short to open circuit conditions at the intermediate-frequency stage means and comprising a low-pass $\pi$-type network including the said impedance element as a series arm, the mixing element as one shunt arm, and a further shunt arm including at least a part of the voltage divider, the ratio of the two shunt arms and the losses in the said further shunt arm being adjusted so that the positive resistance reflected back from the intermediate-frequency stage means a‹ both the said short and open circuit conditions is less than the negative resistance of the mixing element at frequencies different than the said radio-frequency and local-oscillation frequencies.

2. Apparatus as claimed in claim 1 and in which the said further shunt arm contains a lossy-core transformer of significant loss at the resonant frequency of the $\pi$-type network.

3. Apparatus as claimed in claim 1 and in which the said radio frequency is an ultra-high-frequency, the said local oscillation frequency is lower than the radio frequency, the said impedance element is a choke and the said different frequencies lie below the said local oscillation frequency.

4. Apparatus as claimed in claim 1 and in which the said mixing element is a tunnel diode more tightly coupled to a local oscillation circuit than to the said radio-frequency input.

5. Converter apparatus having, in combination, a two-terminal negative-resistance mixing element for producing an intermediate frequency from radio-frequency and local-oscillation frequency inputs thereto, a radio-frequency and local-oscillation-frequency-suppressing impedance element connected to the mixing element, a resistive direct-current voltage divider connected to the said impedance element and to intermediate-frequency stage means, and means for preventing spurious oscillation with the mixing element at frequencies in the region of the said intermediate frequency caused by impedance changes ranging from substantial short to open circuit conditions at the intermediate-frequency stage means and comprising means for adjusting the positive resistance reflected back from the intermediate-frequency stage means at both the said short and open circuit conditions to a value less than the negative resistance of the mixing element at frequencies different than the said radio-frequency and local-oscillation frequencies.

No references cited.

KATHLEEN H. CLAFFY, *Primary Examiner.*

R. S. BELL, *Assistant Examiner.*